(12) United States Patent
Choi et al.

(10) Patent No.: US 8,658,536 B1
(45) Date of Patent: Feb. 25, 2014

(54) SELECTIVE FIN CUT PROCESS

(75) Inventors: Dae-Han Choi, Loudonville, NY (US);
Jae Hee Hwang, Watervliet, NY (US);
Wontae Hwang, Clifton Park, NY (US)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 13/603,725

(22) Filed: Sep. 5, 2012

(51) Int. Cl.
*H01L 21/311* (2006.01)

(52) U.S. Cl.
USPC .... 438/699; 438/296; 438/424; 257/E21.409; 257/E21.546

(58) Field of Classification Search
USPC ........... 257/E21.409, E21.546; 438/699, 296, 438/424
See application file for complete search history.

(56) References Cited

U.S. PATENT DOCUMENTS

| 8,183,101 | B2 * | 5/2012 | Mulfinger et al. | 438/157 |
|---|---|---|---|---|
| 8,377,779 | B1 * | 2/2013 | Wang | 438/283 |
| 8,461,008 | B2 * | 6/2013 | Cho | 438/296 |
| 8,541,286 | B2 * | 9/2013 | Park | 438/427 |
| 2010/0308409 | A1 | 12/2010 | Johnson et al. | |
| 2011/0014791 | A1 | 1/2011 | Johnson et al. | |
| 2011/0045648 | A1 * | 2/2011 | Knorr et al. | 438/296 |
| 2011/0068431 | A1 * | 3/2011 | Knorr et al. | 257/506 |
| 2011/0198673 | A1 | 8/2011 | Bonser et al. | |
| 2012/0049294 | A1 * | 3/2012 | Chen et al. | 257/401 |
| 2012/0088349 | A1 * | 4/2012 | Tang et al. | 438/424 |
| 2012/0168833 | A1 | 7/2012 | Bonser et al. | |
| 2012/0168913 | A1 | 7/2012 | Toh et al. | |
| 2013/0065326 | A1 * | 3/2013 | Sudo | 438/3 |
| 2013/0115721 | A1 * | 5/2013 | Clark | 438/12 |
| 2013/0217204 | A1 * | 8/2013 | Park | 438/424 |
| 2013/0244387 | A1 * | 9/2013 | Cho | 438/283 |

* cited by examiner

*Primary Examiner* — Alexander Sofocleous
*Assistant Examiner* — Ankush Singal
(74) *Attorney, Agent, or Firm* — Steven Wenicki, Esq.; Kevin P. Radigan, Esq.; Heslin Rothenberg Farley & Mesiti P.C.

(57) ABSTRACT

A process is provided for selective removal of one or more unwanted fins during FINFET device fabrication. In one aspect, the process includes: providing a conformal protective layer over multiple fin structures on a substrate; patterning one or more openings over the unwanted fin structure(s); and removing at least a top portion of the unwanted fin structure(s) exposed through the opening(s), the removing including removing at least a portion of the conformal protective layer over the unwanted fin structure(s) exposed through the opening(s). In enhanced aspects, the removing includes removing a hard mask from the at least one unwanted fin structure(s) exposed through the opening(s), and selectively removing semiconductor material of at least one unwanted fin structure(s). The conformal protective layer protects one or more remaining fin structures during the selective removal of the semiconductor material of the unwanted fin structure(s).

20 Claims, 7 Drawing Sheets

SELECTIVE FIN CUT PROCESS

FIELD OF THE INVENTION

The present invention generally relates to semiconductor devices and methods of fabricating semiconductor devices, and more particularly, to methods of fin cut, that is, to methods of removal of unwanted fin structures, for example, during bulk FINFET fabrication.

BACKGROUND OF THE INVENTION

In contrast to traditional planar metal-oxide-semiconductor, field-effect transistors (MOSFETs), which are fabricated using conventional lithographic fabrication methods, non-planar FETs incorporate various vertical transistor structures. One such semiconductor structure is the "FINFET", which takes its name from the multiple semiconductor "fins" that are used to form the respective gate channels, and which are typically on the order of tens of nanometers in width. Advantageously, the fin structure helps to control current leakage through the transistor in the off stage, and a double gate or tri-gate structure may be employed to control short channel effects.

FIGS. 1A & 1B illustrate a top plan view and isometric view, respectively, of a typical FINFET 100. In the embodiment illustrated, FINFET 100 includes a gate 101 which is wrapped around the top and sides of a fin structure 103. A source 105 is formed at one end of fin structure 103, and a drain 107 is formed at the other end.

While FIGS. 1A & 1B depict a single FINFET, during FINFET fabrication a large number of fin structures are typically provided close together in a bulk process. After bulk fin formation, a fin cut or fin removal process may be employed to remove unwanted fin structures from the particular circuit or device being fabricated. As explained further herein, this fin cut processing can often leave unwanted fin residue, or result in excessive semiconductor removal.

Accordingly, a need exists for an enhanced fin cut process, for example, for use during FINFET device fabrication, which does not leave unwanted fin residue or result in excessive semiconductor removal.

BRIEF SUMMARY

The shortcomings of the prior art are overcome and advantages are provided through the provision, in one aspect, of a method which includes: providing a conformal protective layer over multiple fin structures on a substrate; patterning at least one opening over at least one unwanted fin structure of the multiple fin structures; and removing at least a top portion of the unwanted fin structure(s) exposed through the at least one opening, the removing including removing at least a portion of the conformal protective layer over the at least one unwanted fin structure exposed through the at least one opening.

In enhanced aspects, the unwanted fin structure(s) includes a hard mask, the conformal protective layer resides over the hard mask, and the removing includes removing the hard mask from the at least one unwanted fin structure exposed through the at least one opening. Further, the multiple fin structures include a semiconductor material, and the removing exposes the semiconductor material of the at least one unwanted fins structure. In one embodiment, the removing is performed using an unselective dry-etch process. The method may then further include selectively removing the semiconductor material of the at least one unwanted fin structure using, for example, a selective semiconductor wet-etch. During this process, the conformal protective layer (and the hard mask) over the remaining fin structures, protects the remaining fin structures. After removal of the semiconductor material, the protective layer may be removed from the remaining fin structures.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

Reference is made below to the drawings, which are not drawn to scale for ease of understanding, wherein the same reference numbers used throughout different figures designate the same or similar components.

Figure 1A:
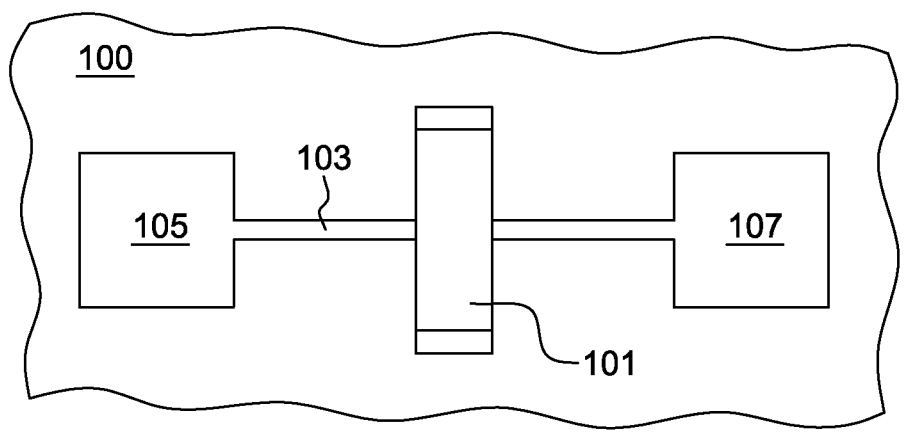
FIG. 1A is a top plan view of one embodiment of a conventional FINFET.
Figure 1B:
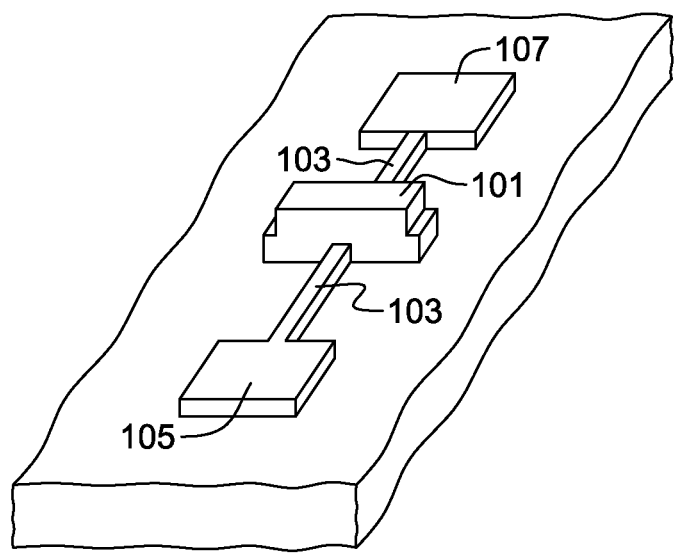
FIG. 1B is an isometric view of the FINFET of FIG. 1A.
Figure 2A:
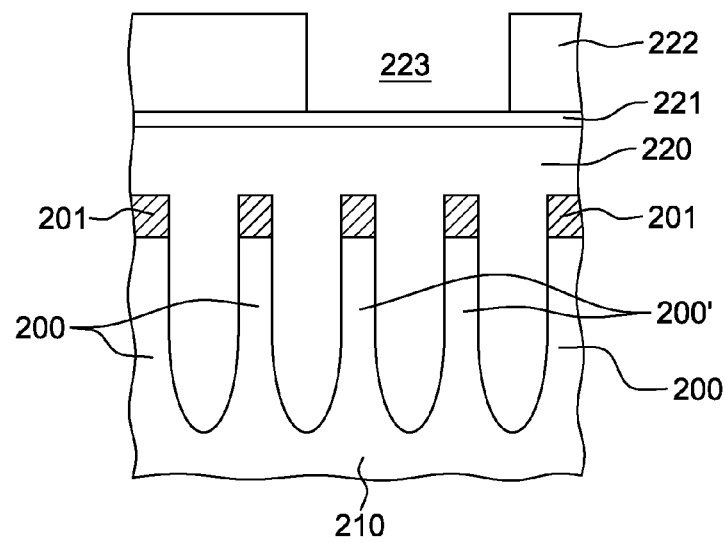
FIGS. 2A-2C illustrate one embodiment of a fin cut process where fin cut is selective to the planarization material, and fin cut time is under or on target (FIG. 2B) or fin cut time is over target (FIG. 2C)

FIG. 2A depicts one embodiment of an intermediate structure obtained during bulk FINFET formation, wherein multiple fin structures 200 reside on a substrate 210, which includes, for example, a semiconductor material. In one embodiment, silicon on insulator (SOI) fabrication processing may be employed to obtain the intermediate structure depicted. A hard mask 201 resides at the top of each fin structure 200. As illustrated, the fin structures 200 are spaced apart, and during bulk FINFET fabrication processing, more fin structures may have been created than required for a particular circuit or device. Thus, a bulk fin cut or fin removal process is employed to remove one or more unwanted fin structures from the intermediate structure. This is achieved in FIG. 2A by providing a planarization material 220 over the multiple fin structures 200, and an antireflective coating 221 and photoresist 222 over the planarization material. An opening 223 is patterned into photoresist 222 over unwanted fins 200' in this example.

Figure 2B:
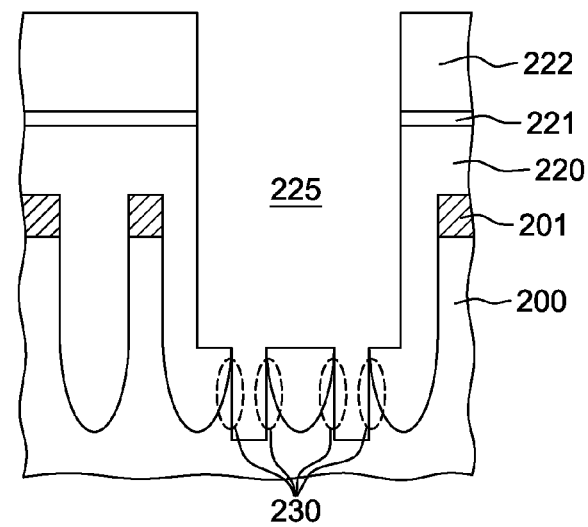

As illustrated in FIG. 2B, a one-step fin cut selective to the planarization material may then be performed, and when the fin cut time process is under-timed or on target, semiconductor fence regions 230 may remain as a shadow, having been blocked by the planarization material. In one embodiment, the planarization material may be an optical planarization layer (OPL) or optical dispersive layer (ODL), which during the timed etching, blocks the semiconductor etch, causing the illustrated fence or spikes 230 in the semiconductor material. In one specific example, the semiconductor material is silicon, and the planarization material is an organic fill material. A selective process may be used to remove the organic material and the unwanted fin structures in the open area 223 (FIG. 2A), 225 (FIG. 2B) of the photoresist pattern, and the removal rate of the unwanted fins 200' and the organic fill 220, is approximately the same. Dry-etching (such as reactive-ion etching) may be employed in a timed etch, since there is no stopping layer in this process.

Figure 2C:
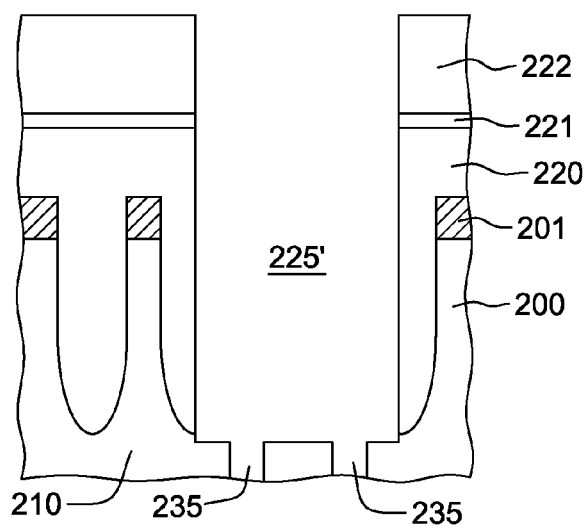

FIG. 2C depicts an alternative result, where fin cut time is over-target in removing the planarization material 220 from the opening 225'. The result is that excessive recesses 235 are formed in the substrate material 210. These recesses are unavoidable if the substrate fence or spikes 230 (FIG. 2B) are to be removed using the process depicted in FIGS. 2A-2C.

Generally stated, disclosed herein is an enhanced fin cut processing that can be accomplished with minimal FINFET residue and minimal unwanted recessing. The fin cut processing disclosed is selective, and can be integrated with existing FINFET device fabrication processing. The method includes, in one aspect, providing a conformal protective layer over multiple fin structures on a substrate, patterning at least one opening over at least one unwanted fin structure of the multiple fin structures, and removing at least a portion of the at least one unwanted fin structure exposed through the at least one opening. This removing includes removing at least a portion of the conformal protective layer over the at least one unwanted fin structure exposed through the at least one opening.

In one implementation, the unwanted fin structure(s) may include a hard mask, and the conformal protective layer resides over the hard mask. In this configuration, the removing includes removing the hard mask from the unwanted fin structure(s) exposed through the opening(s) in the photoresist. The multiple fin structures may further include semiconductor material, and the removing exposes the semiconductor material of the unwanted fin structure(s). The method further includes subsequently selectively removing the semiconductor material from the unwanted fin structure(s). During this process, the conformal protective layer protects the one or more remaining fin structures. After selectively removing the semiconductor material of the unwanted fin structure(s), and thereby effectively removing the unwanted fin structure(s), the conformal protective layer may be removed from the remaining fin structure(s). In one embodiment, the conformal protective layer is, for example, conformally deposited to a thickness less than or equal to 5 nanometers, and more particularly, to a thickness less than or equal to 3 nanometers. As one example, the conformal protective layer may be an oxide layer formed over the multiple fin structures disposed on the substrate.

Figure 3:
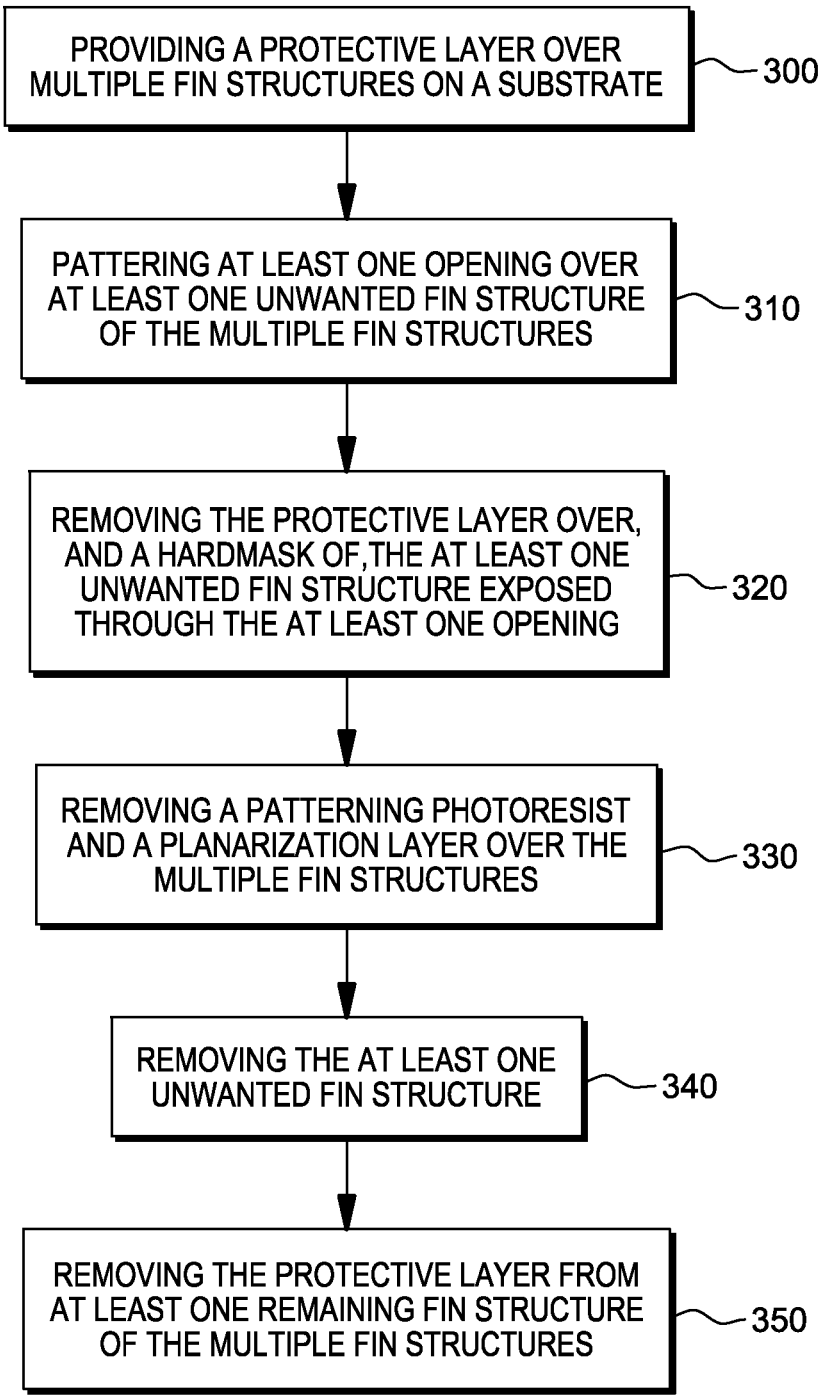
FIG. 3 depicts one embodiment of a fin cut process, in accordance with one or more aspects of the present invention.

FIG. 3 depicts a process overview of one embodiment of the bulk fin cut method disclosed herein. Referring to FIG. 3, the process includes (in one embodiment) providing a protective layer over multiple fin structures disposed on a substrate 300. As noted, this protective layer may comprise a thin, conformally deposited or grown layer of, for example, oxide material. One or more openings are then patterned over one or more unwanted fin structures of the multiple fin structures 310. The protective layer and the hard mask of the unwanted fin structure(s) exposed through the opening(s) are then removed to expose the semiconductor material of the unwanted fin structure(s) 320. The patterning photoresist, and planarization layer over the multiple fin structures is then removed 330, followed by selective removal of the semiconductor material of the at least one unwanted fin structure, thereby effectively removing the unwanted fin structure 340. This removal of the semiconductor material may be a timed etch, selected to cleanly remove the unwanted fin structure(s). The conformal protective layer may then be removed from the remaining fin structure(s) of the multiple fin structures formed in bulk during FINFET fabrication processing.

FIGS. 4A-4H illustrate one example of such a process in greater detail.

Figure 4A:
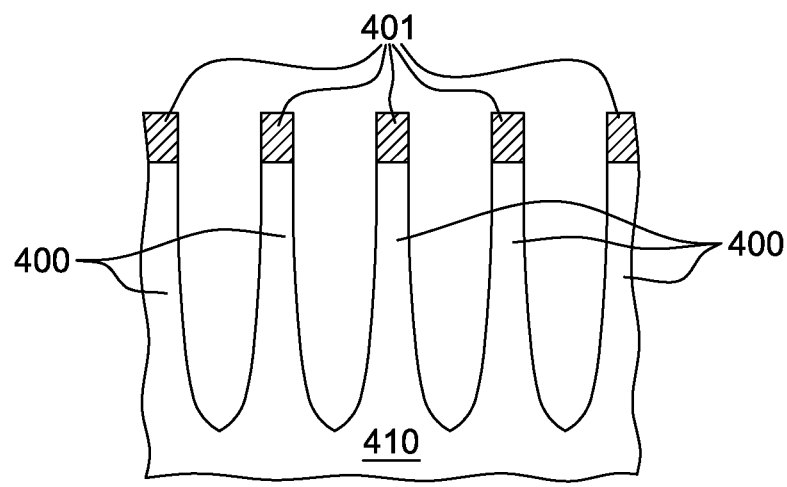
FIG. 4A depicts one embodiment of an intermediate structure comprising multiple fin structures obtained during bulk FINFET formation, in accordance with one or more aspects of the present invention.

As shown in FIG. 4A, an intermediate structure is obtained during bulk FINFET fabrication processing, which includes multiple fin structures 400 disposed on a substrate 410. In one embodiment, fin structures 400 may be formed by removing material from substrate 410, resulting in the illustrated, spaced fin structures 400. This removal processing may be facilitated by provision of a hard mask 401 patterned to provide the desired fin structure configurations. By way of specific example, the intermediate structure illustrated may have fin structures which are 10-25 nm wide and (for example) 100-200 nm high, from substrate 210. In one bulk FINFET fabrication process, a large number of such fins are formed concurrently. Depending on the circuit or device being fabricated, in certain areas the fin structures will be needed, and in other areas, the fin structures will need to be removed. This removal of fin structures is referred to as the fin cut process. In one specific example, the semiconductor material of the substrate and fin structures is or includes silicon. Further, by way of example, the hard mask 401 may be a nitride, with a thickness (for example) of 30-50 nm.

Figure 4B:
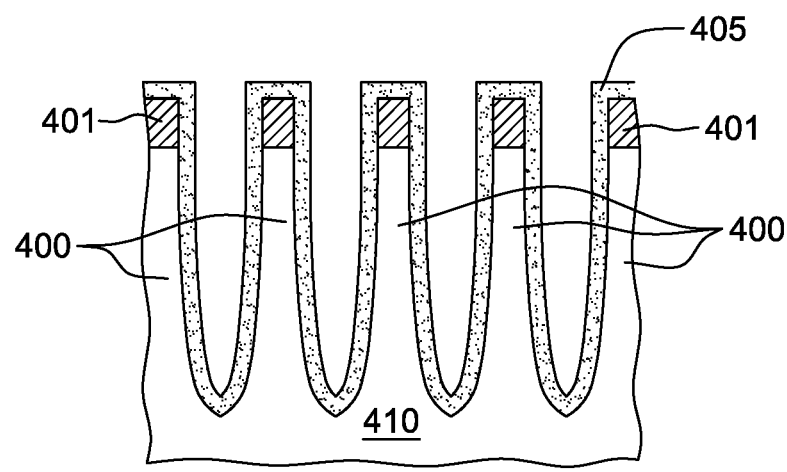
FIG. 4B depicts the intermediate structure of FIG. 4A after provision of a conformal protective layer over the multiple fin structures, in accordance with one or more aspects of the present invention.

FIG. 4B depicts the intermediate structure of FIG. 4A, after provision of a conformal protective layer 405 over the multiple fin structures. In one example, the conformal protective layer has a thickness less than or equal to 5 nm, and more particularly, a thickness less than or equal to 3 nm. In one implementation, the protective layer is an oxide layer conformally provided over the multiple fin structures.

Figure 4C:
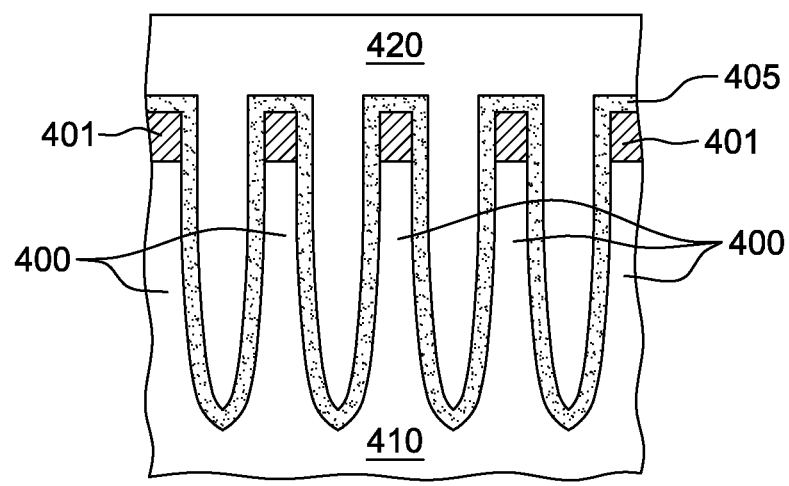
FIG. 4C depicts the intermediate structure of FIG. 4B after provision of planarization material over the multiple fin structures, in accordance with one or more aspects of the present invention.
Figure 4D:
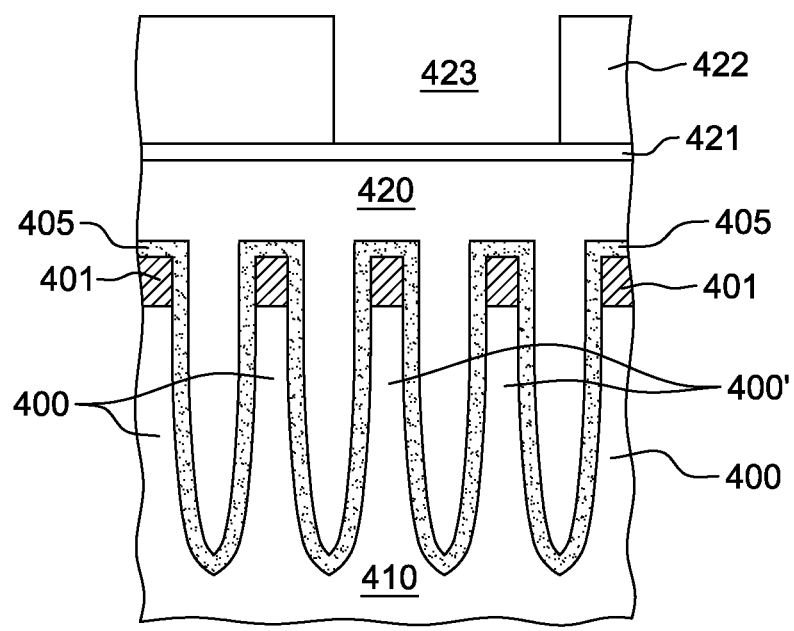
FIG. 4D depicts the intermediate structure of FIG. 4C after provision of an antireflective coating and patterning of a photoresist to provide an opening over one or more unwanted fin structures, in accordance with one or more aspects of the present invention.
Figure 4E:
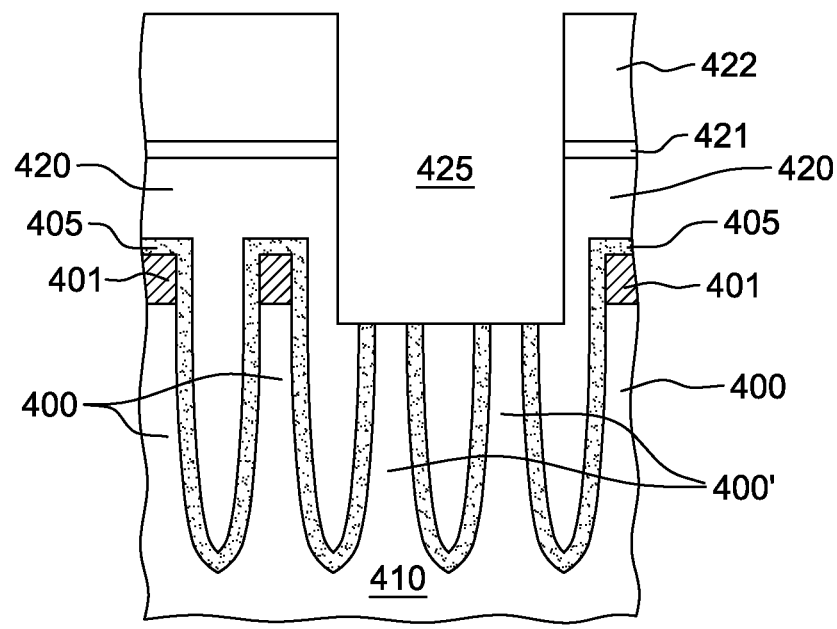
FIG. 4E illustrates the intermediate structure of FIG. 4D after unselective removal of planarization material, hard mask, and the conformal protective layer over the unwanted fin structures, in accordance with one or more aspects of the present invention.
Figure 4F:
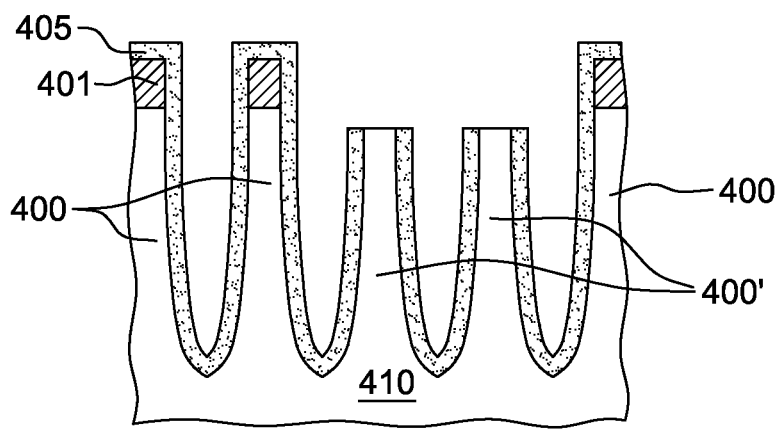
FIG. 4F depicts the intermediate structure of FIG. 4E after removal of the photoresist layer, antireflective coating, and planarization material, in accordance with one or more aspects of the present invention.
Figure 4G:
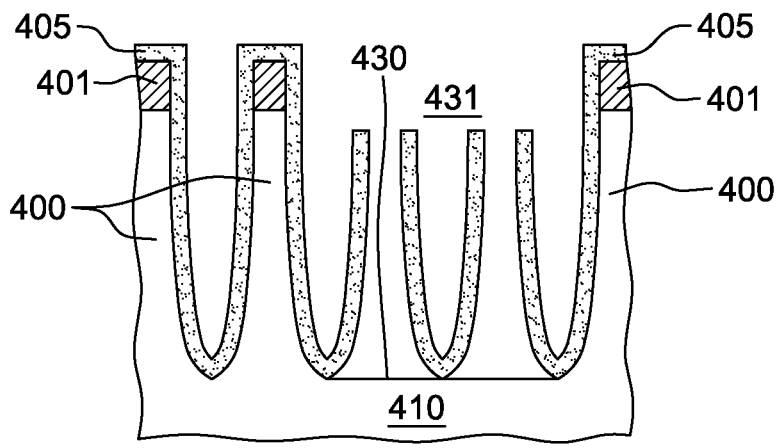
FIG. 4G depicts the intermediate structure of FIG. 4F after selective wet-etching of semiconductor material from the exposed, unwanted fin structures, in accordance with one or more aspects of the present invention.

To facilitate opening or removal of the hard mask and conformal protective layer over the unwanted fin structure(s), a planarization material 420 is provided over the multiple fin structures 400, as illustrated in FIG. 4C. This planarization material (or layer) may be, for example, an optical dispersion layer (ODL) with a thickness over the fin structures of 100-135 nm. As illustrated in FIG. 4D, an antireflective coating 421 may then be applied, followed by a photoresist 422, which may be patterned with one or more openings 423. The one or more openings 423 align over one or more unwanted fin structures 400' to be removed. As one example, the antireflective coating (ARC) may have a thickness of 30-50 nm, and the photoresist a thickness of approximately 100 nm.

At least a portion of the protective layer, as well as the hard mask, are then removed from the unwanted fin structure(s) 400' by, for example, dry-etching through the patterned photoresist to provide a deepened opening 425 in the intermediate structure. Wet OPL removal may then be employed to remove the photoresist, antireflective coating, and planarization layer, resulting in the structure illustrated in FIG. 4F, wherein the semiconductor material within unwanted fin structure(s) 400' is exposed, and the remaining fin structures 400 are protected by the conformal protective layer 405.

The unwanted fin structure(s), and in particular the semiconductor material of the unwanted fin structure(s), may then be removed using a selective wet-etch (such as a TMAH or KOH anisotropic wet-etch) or a highly-selective, iso-dry-etch (such as a $HBr/O_2/Cl_2$ chemistry etch in a microwave or remote plasma/downstream etch). In either case, the etch is a timed etch (for instance, two to five minutes), and is selected to remove substantially all of the unwanted fin structure(s), which results in a much smoother base surface 430 in the resultant opening 431.

Figure 4H:
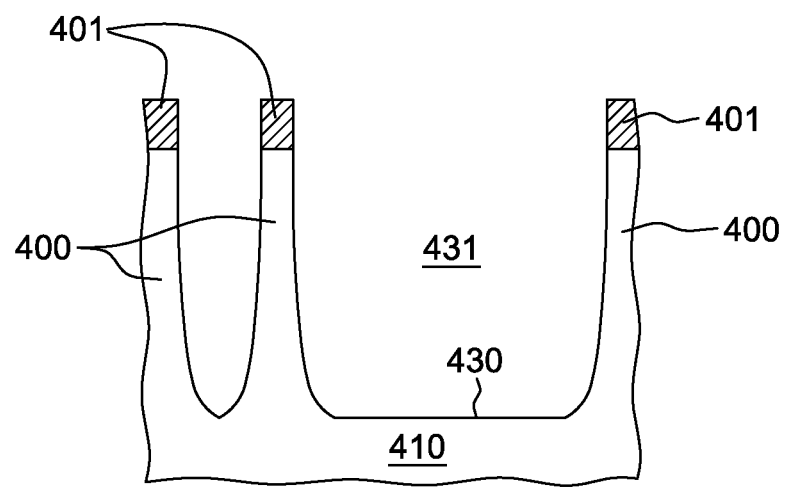
FIG. 4H depicts a resultant structure obtained after removal of the conformal protective layer, including from the remaining fin structures, in accordance with one or more aspects of the present invention.

After removal of the unwanted fin structures, the conformal protective layer 405 may be removed, with the resultant structure depicted in FIG. 4H.

Advantageously, the desired opening 431 has a cleaner base surface 430 than achievable using the fin cut process of FIGS. 2A-2C. In accordance with the processing of FIGS. 3-4H, fin structures may be cleanly removed, without any fence defects remaining. The processing disclosed is particularly advantageous with tall fin structures. Conventional fin cut processing requires a non-selective process to remove both the fin structures and the fill material (e.g., OPL), which risks the removal of neighboring fin structures. If a selective process to the fill material is used, as illustrated in FIGS. 2A-2C, semiconductor fencing can happen due to the shading effect of the fill material. The fin cut process of FIGS. 3-4H advantageously avoids these drawbacks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   providing a conformal protective layer over multiple fin structures on a substrate;
   patterning at least one opening over at least one unwanted fin structure of the multiple fin structures; and
   removing at least a portion of the at least one unwanted fin structure exposed through the at least one opening, the removing including removing at least a portion of the conformal protective layer over the at least one unwanted fin structure exposed through the at least one opening.

2. The method of claim 1, wherein the at least one unwanted fin structure further comprises a hard mask, the conformal protective layer residing over the hard mask, and the removing comprises removing the hard mask from the at least one unwanted fin structure exposed through the at least one opening.

3. The method of claim 1, wherein the multiple fin structures comprise a semiconductor material, and the removing exposes the semiconductor material of the at least one unwanted fin structure, and wherein the method further comprises subsequently selectively removing the semiconductor material of the at least one unwanted fin structure, wherein the conformal protective layer protects at least one remaining fin structure of the multiple fin structures during the selective removing of the semiconductor material of the at least one unwanted fin structure.

4. The method of claim 3, further comprising:
   removing, after the selectively removing of the semiconductor material of the at least one unwanted fin structure, the conformal protective layer from the at least one remaining fin structure of the multiple fin structures.

5. The method of claim 1, wherein providing the conformal protective layer comprises providing the conformal protective layer with a thickness over the multiple fin structures less than or equal to 5 nanometers.

6. The method of claim 5, wherein providing the conformal protective layer comprises conformally depositing an oxide over the multiple fin structures.

7. The method of claim 5, wherein the at least one unwanted fin structure further comprises a hard mask, the conformal protective layer resides over the hard mask, and the removing comprises removing the hard mask from the at least one unwanted fin structure exposed through the at least one opening.

8. The method of claim 5, wherein the multiple fin structures comprise a semiconductor material, and the removing exposes the semiconductor material of the at least one unwanted fin structure, and wherein the method further comprises subsequently selectively removing the semiconductor material of the at least one unwanted fin structure, wherein the conformal protective layer protects at least one remaining fin structure of the multiple fin structures during the selective removing of the semiconductor material of the at least one unwanted fin structure.

9. The method of claim 8, further comprising:
    removing, after the selectively removing of the semiconductor material of the at least one unwanted fin structure, the conformal protective layer from the at least one remaining fin structure of the multiple fin structures.

10. The method of claim 1, wherein the patterning further comprises providing a photoresist layer over the planarization material, and wherein the at least one opening over the at least one unwanted fin structure extends through the photoresist layer.

11. The method of claim 10, wherein the patterning further comprises providing an antireflective coating between the planarization material and the photoresist layer, and wherein the at least one opening over the at least one unwanted fin structure extends through the photoresist layer and the antireflective coating, at least partially into the planarization material.

12. The method of claim 11, wherein the at least one unwanted fin structure further comprises a hard mask, the conformal protective layer resides over the hard mask, and the removing comprises removing the hard mask from the at least one unwanted fin structure exposed through the at least one opening.

13. The method of claim 11, wherein the multiple fin structures comprise a semiconductor material, and the removing exposes the semiconductor material of the at least one unwanted fin structure, and wherein the method further comprises subsequently selectively removing the semiconductor material of the at least one unwanted fin structure, wherein the conformal protective layer protects at least one remaining fin structure of the multiple fin structures during the selective removing of the semiconductor material of the at least one unwanted fin structure.

14. The method of claim 13, further comprising:
    removing, after the selectively removing of the semiconductor material of the at least one unwanted fin structure, the conformal protective layer from the at least one remaining fin structure of the multiple fin structures.

15. The method of claim 1, wherein the removing comprises dry-etching the at least a top portion of the unwanted fin structure exposed through the at least one opening, the dry-etching including removing the at least a portion of the conformal protective layer over the at least one unwanted fin structure exposed through the at least one opening.

16. The method of claim 15, wherein the at least one unwanted fin structure further comprises a hard mask, the conformal protective layer residing over the hard mask, and the removing further comprises dry-etching the hard mask from the at least one unwanted fin structure exposed through the at least one opening.

17. The method of claim 15, wherein the multiple fin structures comprise a semiconductor material, and the removing exposes the semiconductor material of the at least one unwanted fin structure, and wherein the method further comprises subsequently selectively wet-etching the semiconductor material of the at least one unwanted fin structure, wherein the conformal protective layer protects at least one remaining fin structure of the multiple fin structures during the selective wet-etching of the semiconductor material of the at least one unwanted fin structure.

18. The method of claim 17, further comprising removing, after the wet-etching of the semiconductor material of the at least one unwanted fin structure, the conformal protective layer from the at least one remaining fin structure of the multiple fin structures.

19. The method of claim 1, wherein the providing comprises providing the conformal protective layer with a thickness less than or equal to 5 nanometers, and wherein the at least one unwanted fin structure further comprises a hard mask and a semiconductor material below the hard mask, and wherein the removing at least the portion of the unwanted fin structure comprises dry-etching the at least a portion of the conformal protective layer over the at least one unwanted fin structure and dry-etching the hard mask from the at least one unwanted fin structure to expose the semiconductor material thereof, and wherein the method further comprises:
    subsequently wet-etching the semiconductor material of the at least one unwanted fin structure, wherein the conformal protective layer protects at least one remaining fin structure of the multiple fin structures during the wet-etching of the semiconductor material of the at least one unwanted fin structure; and
    removing, after the wet-etching of the semiconductor material of the at least one unwanted fin structure, the conformal protective layer from the at least one remaining fin structure of the multiple fin structures.

20. The method of claim 19, wherein the conformal protective layer comprises an oxide.

* * * * *